United States Patent
Nakano et al.

(10) Patent No.: US 12,066,485 B2
(45) Date of Patent: *Aug. 20, 2024

(54) CIRCUIT FAULT DETECTION APPARATUS

(71) Applicant: DENSO CORPORATION, Kariya (JP)

(72) Inventors: Yuichiro Nakano, Kariya (JP); Yohei Nakakura, Kariya (JP)

(73) Assignee: DENSO CORPORATION, Kariya (JP)

( * ) Notice: Subject to any disclaimer, the term of this patent is extended or adjusted under 35 U.S.C. 154(b) by 696 days.

This patent is subject to a terminal disclaimer.

(21) Appl. No.: 17/203,453

(22) Filed: Mar. 16, 2021

(65) Prior Publication Data

US 2021/0208195 A1 Jul. 8, 2021

Related U.S. Application Data

(63) Continuation of application No. PCT/JP2019/029000, filed on Jul. 24, 2019.

(30) Foreign Application Priority Data

Sep. 18, 2018 (JP) ................................. 2018-174048

(51) Int. Cl.
*G01R 31/28* (2006.01)
*G01R 19/165* (2006.01)

(52) U.S. Cl.
CPC ... *G01R 31/2884* (2013.01); *G01R 19/16571* (2013.01)

(58) Field of Classification Search
CPC ......... G01R 19/16571; G01R 31/2884; H02M 1/08; H02M 1/32; H03K 17/0822; H03K 2217/0018
See application file for complete search history.

(56) References Cited

U.S. PATENT DOCUMENTS

2006/0002043 A1* 1/2006 DiSalvo ................. H02H 3/105
361/42
2008/0297242 A1* 12/2008 Vig ..................... G01R 31/2829
327/576

(Continued)

FOREIGN PATENT DOCUMENTS

CN 111313874 A * 6/2020
CN 111619352 A * 9/2020 .............. B60L 3/003

(Continued)

OTHER PUBLICATIONS

U.S. Appl. No. 17/203,338, filed Mar. 16, 2021, Yuichiro Nakano et al.

(Continued)

*Primary Examiner* — Mischita L Henson
(74) *Attorney, Agent, or Firm* — Harness, Dickey & Pierce, P.L.C.

(57) ABSTRACT

A circuit fault detection apparatus includes an AD conversion circuit, a corrector, a threshold value setting device and a fault detector. The AD conversion circuit detects a voltage corresponding to a current flowing through a circuit fault detection element connected to the electric circuit or a voltage applied to the circuit fault detection element, and converts the voltage to a digital value. The corrector corrects the digital value or a measurement value as a voltage value representative of the digital value to a corrected measurement value. The threshold value setting device sets a threshold value closer to a normal value side than a limit value of the corrected measurement value determined based on a convertible range of the AD conversion circuit. The fault detector detects whether the fault occurs in the electric circuit, based on comparison between the threshold value and the corrected measurement value.

9 Claims, 5 Drawing Sheets

(56) References Cited

U.S. PATENT DOCUMENTS

2010/0127729 A1* 5/2010 Zjajo .............. G01R 31/318558
     324/757.03
2012/0250203 A1* 10/2012 Makihara .......... G01R 31/3835
     324/750.01

FOREIGN PATENT DOCUMENTS

| CN | 1747305 | * | 4/2021 | ........... G01R 15/202 |
| JP | H10256541 A | | 9/1998 | |
| JP | 2000134955 A | | 5/2000 | |

OTHER PUBLICATIONS

U.S. Appl. No. 17/203,388, filed Mar. 16, 2021, Yuichiro Nakano et al.

* cited by examiner

CIRCUIT FAULT DETECTION APPARATUS

CROSS REFERENCE TO RELATED APPLICATION

The present application is a continuation application of International Patent Application No. PCT/JP2019/029000 filed on Jul. 24, 2019, which designated the U.S. and claims the benefit of priority from Japanese Patent Application No. 2018-174048 filed on Sep. 18, 2018. The entire disclosures of all of the above applications are incorporated herein by reference.

TECHNICAL FIELD

The present disclosure relates to a circuit fault detection apparatus for detecting a fault in an electric circuit.

BACKGROUND

An overcurrent detection circuit may detect an overcurrent. A current value measured through a shunt resistor may be converted to a voltage value, and then a digital value for indicating the voltage value may be read through an AD conversion circuit.

SUMMARY

The present disclosure describes a circuit fault detection apparatus for detecting a fault in an electric circuit. The circuit fault detection apparatus includes an AD conversion circuit, a corrector, a threshold value setting device, and a fault detector.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
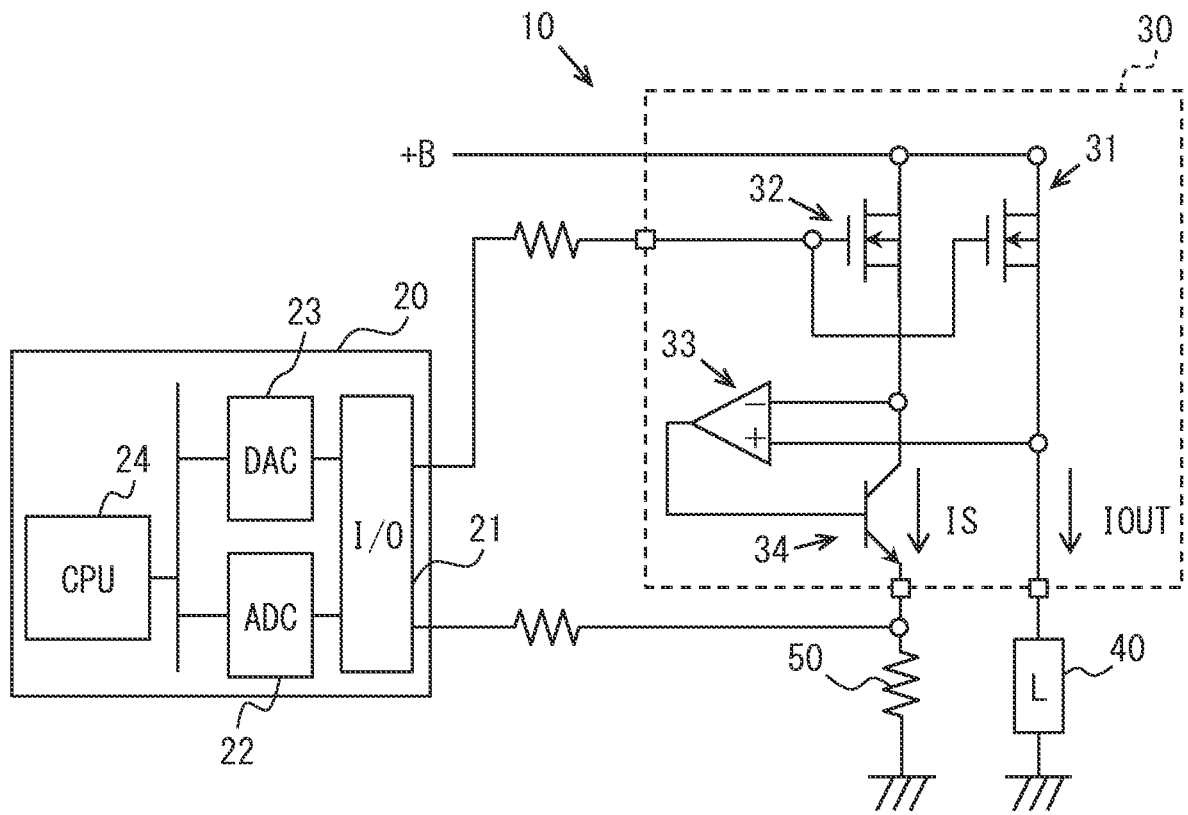
FIG. 1 illustrates a configuration of an electric circuit and an MPU.

For detecting an overcurrent, a digital value indicating a measured voltage value may be compared with a threshold value. The correspondence relational expression, which indicates a correspondence relation between a measured voltage value or a current value corresponding to the measured voltage value and a digital value, is a straight line. The slope of the straight line may be adjusted by changing the value of a catalog resistor value (hereinafter referred to as a catalog value) of a utilized resistor. In view of individual difference, the relation between the measured voltage value or the current value corresponding to the measured voltage value and the digital value may be required to be corrected individually.

For enhancing detection resolution of the voltage value and the current value corresponding to the voltage value, the slope of the correspondence relational expression may be enlarged to some extent. Therefore, it may be required to utilize a resistor having a resistance value that increases the slope of the correspondence relational expression to some extent.

The threshold value for detecting an overcurrent is a value at which an overcurrent can be detected in a situation where the normal current value slightly exceeds the threshold value. In view of the above, it may be preferable to have a lower threshold value.

Since the resistor has a temperature dependence, the relation between the voltage value detected by the resistor or the current value corresponding to the voltage value and the digital value also has the temperature dependence. In other words, even though the current value is the same as normal, the output digital value may fluctuate. Therefore, there may be a limit to lower the threshold value.

On the other hand, if the threshold value is set to an excessively high value, the overcurrent may not be detected in many situations. Therefore, it may not be preferable to set the threshold value too high.

In a situation of detecting the overcurrent, it may be required to set the threshold value in a range so that the normal current value is not erroneously detected as the overcurrent even if individual differences are taken into consideration while the overcurrent can be detected promptly.

The range of the magnitude of the analog signal that the AD conversion circuit can convert into a digital value is fixed. As the slope of the correspondence relational expression is larger, the digital value corresponding to the voltage value may easily reach the upper limit of the digital value that can be output by the AD conversion circuit. In a situation where the digital value corresponding to the voltage value exceeds the upper limit of the digital value which can be output by the AD conversion circuit, the upper limit value is output regardless of the magnitude of the measured voltage value. As the voltage value represented by the threshold value is higher than the voltage value represented by the upper limit value of the digital value, the overcurrent cannot be detected. Therefore, it may be required that the voltage value represented by the threshold value is smaller than the upper limit value of the digital value.

In a situation where the slope of the correspondence relational expression is reduced, since the digital value corresponding to the identical voltage value becomes a smaller value, the voltage value represented by the threshold value does not easily exceed the voltage value represented by the upper limit value of the digital value. In other words, for setting the voltage value represented by the threshold value to be smaller than the voltage value represented by the upper limit value of the digital value, the slope of the correspondence relational expression may be set to be smaller. However, as described above, the slope of the correspondence relational expression cannot be set to be very small due to detection resolution.

As a resistor is used for voltage measurement and the resistance value of the resistor has an individual difference, it may be required to individually correct the relation between the measured voltage value or the current value corresponding to the measured voltage value and the digital value.

The corrected value becomes a value measured in a situation where the resistance value is a catalog value through correcting the actual acquired digital value. Therefore, it is possible to compare the resistance value, which is set as the catalog value, with the threshold value.

By correcting the actual acquired digital value, it is possible to compare with the threshold value set so as not to exceed the voltage value represented by the upper limit value of the digital value. However, the correction may not prevent the digital value from not reaching the upper limit. In a situation where the digital value does not reach the upper limit value, the digital value merely becomes a value which is comparable with the threshold value through correction. Whether or not the digital value reaches the upper limit depends on the resistance value that varies on each individual. In a situation of evaluating the correspondence relational expression indicating the relation between the measured voltage value and the digital value, for an individual with a larger slope of the correspondence relational expression, the upper limit value of the digital value may be lower than the threshold preliminarily set in a situation of the resistance value being the catalog value.

In a device in which the threshold value is preliminarily set and the overcurrent is detected by comparing the digital value acquired by the AD conversion circuit with the threshold value, it is possible that the upper limit of the digital value does not exceed the threshold value and the overcurrent cannot be detected.

The above description relates to difficulties in the overcurrent detection apparatus as an example. However, it may be desirable to detect a disconnection in the circuit. In the circuit fault detection apparatus for detecting the disconnection in the circuit, the digital value may be compared with a threshold value set for detecting the disconnection. The circuit disconnection is detected in a situation where the digital value becomes lower than the threshold value.

Since there is a range in the magnitude of the analog signal in which the AD conversion circuit can convert into the digital value, there is also a lower limit for the magnitude of the analog signal convertible to the digital value through the AD conversion circuit. Similar to the situation of detecting the overcurrent, in a device in which the threshold value is preliminarily set and the circuit disconnection is detected by comparing the digital value acquired by the AD conversion circuit with the threshold value, it is possible that the upper limit of the digital value does not exceed the threshold value and the overcurrent cannot be detected.

Since the value directly detected by the AD conversion circuit is a voltage value, the difficulties may occur in a situation of detecting the overcurrent and in a situation of detecting the circuit disconnection if the circuit fault detection apparatus for detecting a fault of the current value is adopted.

According to an aspect of the disclosure, a circuit fault detection apparatus detects a fault in an electric circuit. The circuit fault detection apparatus includes an AD conversion circuit, a corrector, a threshold value setting device and a fault detector. The AD conversion circuit detects a voltage corresponding to a current flowing through a circuit fault detection element connected to the electric circuit or a voltage applied to the circuit fault detection element, and converts the voltage to a digital value. The corrector corrects the digital value output by the AD conversion circuit or a measurement value as a voltage value representative of the digital value to a corrected measurement value as a value in a situation where a resistance value of the circuit fault detection element is preliminarily set to a standard resistance value. The threshold value setting device sets a threshold value, which is compared with the corrected measurement value, closer to a normal value side than a limit value of the corrected measurement value determined based on a convertible range of the AD conversion circuit. The fault detector detects whether or not the fault occurs in the electric circuit, based on comparison between the threshold value set by the threshold value setting device and the corrected measurement value.

In a situation where the threshold value is a fixed value, the threshold value may be varied in view of the possibility that the corrected measurement value does not exceed the threshold value depending on the individual, even if a voltage to be detected as the fault is applied to the electronic circuit. The threshold value is set closer to the normal value than to the limit value of the corrected measurement value defined based on the convertible range of the AD conversion circuit. According to the above configuration, it is possible to reduce the possibility in which the corrected measurement value does not exceed the threshold value even though the electric circuit has the fault. Therefore, the precision of detecting a fault in the electric circuit is enhanced.

First Embodiment

Hereinafter, embodiments will be described with reference to the drawings. FIG. 1 illustrates an electric circuit 10 and an MPU 20 having a function as a circuit fault detector for monitoring a fault in the electric circuit 10.

The electric circuit 10 includes a power semiconductor device 30, a load 40 and a resistor 50. The power semiconductor device 30 includes a main MOSFET 31 and a sense MOSFET 32. The main MOSFET 31 is a MOSFET for controlling a current flowing through the load 40. The sense MOSFET 32 as a MOSFET for current detection is connected in parallel with the main MOSFET 31. The MPU 20 detects a current fault generated in the electric circuit 10 through detecting a value of the current flowing through the sense MOSFET 32. The sense MOSFET 32 is a circuit fault detection element. The power semiconductor device 30 also includes an operational amplifier 33 and a bipolar transistor 34. The load 40 corresponds to, for example, "L" in FIGS. 1, 10.

The main MOSFET 31 has: a source terminal that is connected to the load 40; a drain terminal that is connected to a power supply voltage +B; and a gate terminal that is connected to the MPU 20. The sense MOSFET 32 has: a source terminal that is connected to a base terminal of the transistor 34 and is connected to an inverting input terminal of the operational amplifier 33; a drain terminal that is connected to the power supply voltage +B; and a gate terminal that is connected to the MPU 20.

The non-inverting input terminal of the operational amplifier 33 is connected to the source terminal of the main MOSFET 31. The transistor 34 has: a base terminal that is connected to an output terminal of the operational amplifier 33; an emitter terminal that is connected to the resistor 50; and a collector terminal that is connected to the source terminal of the sense MOSFET 32.

In the electric circuit 10 having such a configuration, since the output of the operational amplifier 33 is connected to the inverting input terminal, the voltage applied to the inverting input terminal of the operational amplifier 33 become equal to the voltage applied to the non-inverting input terminal. The mathematical expression 1 is satisfied where: RonS is an on-resistance of the sense MOSFET 32; RonK is an on-resistance of the main MOSFET 31; and a main current IOUT is a current flowing through the sense MOSFET 32.

$$RonS*IS=RonK*IOUT \quad \text{(Mathematical Expression 1)}$$

In a situation where the on-resistances RonS, RonK are known, the main current IOUT can be calculated from the mathematical expression 1 by measuring the sense current IS. The MPU 20 reads out a value acquired by converting the sense current IS to a voltage through the resistor 50.

The MPU 20 includes an I/O port 21, an AD conversion circuit (hereinafter referred to as "ADC") 22, a DA conversion circuit (hereinafter referred to as "DAC") 23, and a CPU 24. The ADC 22 receives a voltage value as an analog value input to the MPU 20, and the voltage value is converted to the digital value D and then output. The digital value D is merely a numerical value and has no unit. The digital D is represented as, for example, a discrete value from 0 to 100. As a voltage conversion coefficient is multiplied to the digital value D, the voltage value represented by the digital D is acquired. The DAC 23 converts a digital signal output from the CPU 24 to an analog signal and then output the analog signal.

The CPU 24 determines whether the current flowing through the load 40 has a fault or not based on the magnitude of the digital value D output from the ADC 22 or the voltage value represented by the digital value D. The process of the CPU 24 determining whether or not the current has a fault is defined as a current fault detection process. The digital value D or the voltage value represented by the digital value D is a measurement value measured by the ADC 22.

The fault includes a current value being an excessively large value, in other words, an overcurrent, and a current value being a deficiently small value. The fault where the current value is deficiently small may be assumed that a disconnection occurs. In a situation where the CPU 24 detects the overcurrent, the CPU 24 outputs an off signal to the DAC 23 for turning off the main MOSFET 31 and the sense MOSFET 32. The off signal is converted into an analog signal by the DAC 23, and is input to the respective gate terminals of the main MOSFET 31 and the sense MOSFET 32 through the I/O port 21.

Current Fault Detection Processing

The following describes the current fault detection process executed by the CPU 24. The following describes that the CPU 24 executes the current fault detection process by adopting the measured digital value D. In addition, part or all of the functions of the CPU 24 may be realized by using one or more ICs (in other words, as hardware). In addition, a part or all of the functions of the CPU 24 may be realized by a combination of software execution by the CPU and hardware components. There may be a memory (not shown) connected to a storage of the CPU 24.

As described above, the main current IOUT can be calculated from the mathematical expression 1. For the main MOSFET 31 and the sense MOSFET 32, the MOSFETs having product model numbers with suitable catalog values of the on-resistance RonS and RonK are selected. Therefore, the catalog values of the respective on-resistances RonS, RonK are known. The catalog value may also be called as a standard resistance value.

Initial Error Correction

Since there are individual differences in the on-resistances RonS and RonK, in the current fault detection process, the correction coefficient for correcting the difference in the on-resistances RonS and RonK caused by the individual difference is initially calculated. The errors of the on-resistances RonS and RonK to be corrected initially is defined as an initial error.

Figure 2:
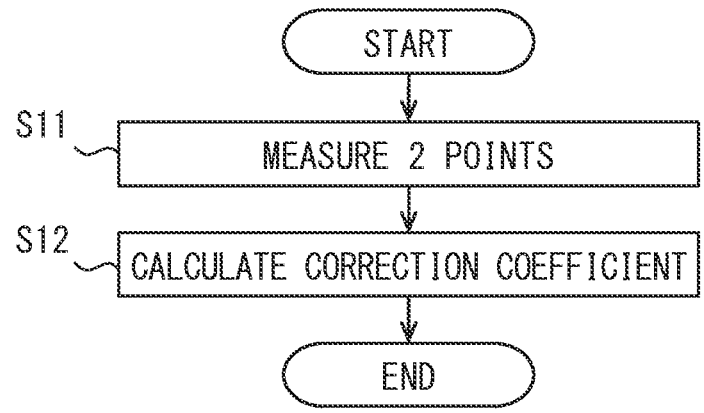
FIG. 2 is a flowchart showing a procedure for calculating a correction coefficient for correcting an initial error.

FIG. 2 is a procedure for calculating a correction coefficient for correcting the initial error. The procedure illustrated in FIG. 2 is executed once by an operator before using the product at, for example, the time of shipment. In S11, the load with a known resistance value is connected to the power semiconductor device 30, and the known power supply voltage is applied to the power semiconductor device 30. Therefore, the main current IOUT can be calculated. The digital value D shown by the ADC 22 is measured. Two types of the load 40 with different resistance values are connected, two sets of the correspondence between the main current IOUT and the digital value D can be acquired by measuring the respective digital values D.

Figure 3:
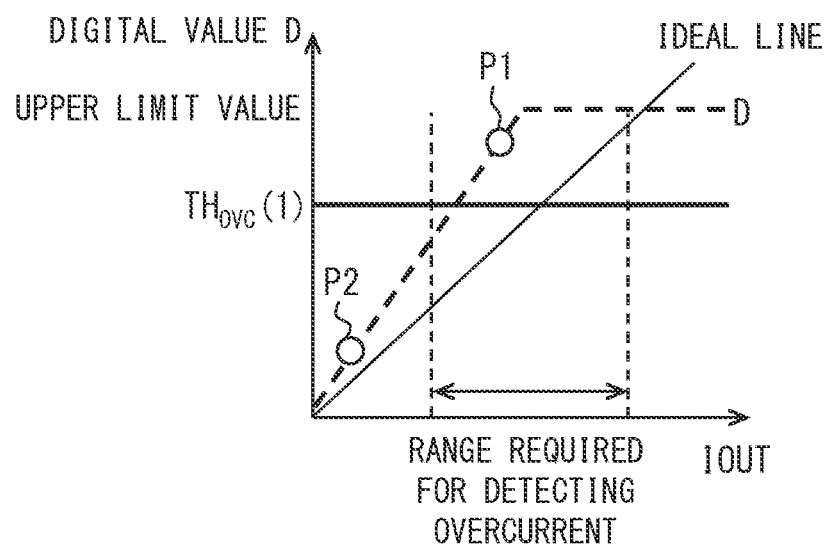
FIG. 3 illustrates an ideal line and a line indicating the relation of a digital value D to a main current IOUT for an actual product.
Figure 4:
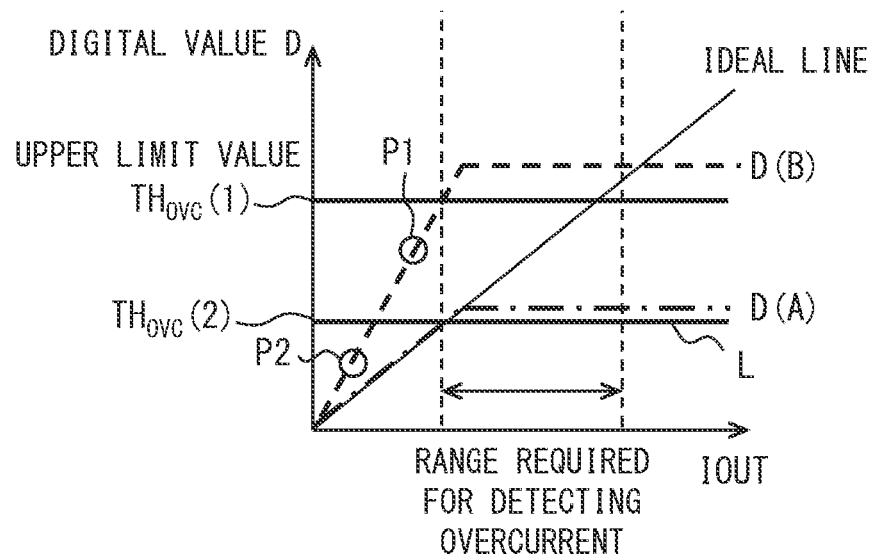
FIG. 4 illustrates the relationship between an initial overcurrent threshold value $TH_{OVC}(1)$ and a corrected overcurrent threshold value $TH_{OVC}(2)$.

Two points P1, P2 shown in FIG. 3 are points indicating the correspondence between the main current IOUT and the digital value D acquired in S1. In FIG. 3, an ideal line is illustrated by a solid line. An ideal line indicates the relationship of the digital value D with respect to the main current IOUT as the respective values of the on-resistance RonS, RonK are catalog values. The ideal line in FIGS. 3 and 4 is also referred to as IDEAL.

On the other hand, a straight line indicated by a broken line connecting P1 and P2 is a line showing the relationship of the digital value D with respect to the main current IOUT in an actual product whose digital value D is measured (hereinafter referred to as an "actual product line"). In S2, a correction coefficient for correcting the slope of the actual product line to the slope of the ideal line is calculated. The correction coefficient is stored in a predetermined non-volatile memory included in the MPU 20.

Setting Overcurrent Threshold Value

FIG. 3 also shows an overcurrent threshold $TH_{OVC}$ in which the overcurrent is required to be detected. The following describes the overcurrent threshold $TH_{OVC}$ in which the overcurrent is required to be detected. It may be ideal that the overcurrent is detected in a situation where a current exceeds a normal current value even a little. For this purpose, it may be preferable to lower the overcurrent threshold value $TH_{OVC}$ as a threshold value for detecting whether or not the main current IOUT is larger than a normal range, in other words, detecting whether or not an overcurrent is flowing. The main current IOUT is an amount to be measured in the present embodiment.

However, the slope of the actual product line may be larger than the slope of the ideal line, because the on-resistances RonS and RonK may have, for example, an initial error or a temperature error. As the slope is larger, the digital value D gets larger even if the main current IOUT flowing through the actual is identical. In a situation where the overcurrent threshold value $TH_{OVC}$ is set too low, it may be possible that the overcurrent is detected even though the overcurrent does not flow through the actual product with a larger slope of the actual product line. On the other hand, in a situation where the overcurrent threshold value $TH_{OVC}$ is set too high, the main current IOUT at a time of detecting the overcurrent becomes too large.

In a situation of considering a variety of causes, the main current IOUT required for detecting the overcurrent is within a certain range. This range is a range required for detecting the overcurrent shown in FIG. 3. The range required for detecting the overcurrent is preliminarily set. The initial overcurrent threshold value $TH_{OVC}(1)$ corresponding to an initial upper threshold value is set to a value intersecting the ideal line in a range required for detecting the overcurrent.

Initial Threshold Value and Corrected Threshold Value

Since the initial overcurrent threshold value $TH_{OVC}(1)$ is set based on the ideal line, it is required for the digital value D, which is compared with the initial overcurrent threshold value $TH_{OVC}(1)$, to be corrected to a value where the relation between the main line IOUT and the digital value D matches the ideal line. Therefore, the correction is executed by multiplying the correction coefficient calculated in S2.

However, the digital value D that can be output by the ADC 22 has an upper limit value determined by the range of input voltage convertible by the ADC 22. As illustrated in FIG. 3, in a case that the upper limit value is not present, even if the ADC 22 receives a voltage value that indicates the main current IOUT having a magnitude exceeding the upper limit value, the output value of the ADC 22 becomes the upper limit value.

In FIG. 4, a dash-dot line represents a change in the digital value D after correction (hereinafter referred to as a corrected digital value D(A)) with respect to the main current IOUT. The corrected digital value D(A) is an example of a measurement value after correction. In FIG. 4, the upper limit of the corrected digital value D(A) is lower than the initial overcurrent threshold value $TH_{OVC}(A)$.

In a situation where the upper limit value of the corrected digital value D(A) is at a magnitude smaller than the initial overcurrent threshold value $TH_{OVC}(1)$, the corrected digital value D(A) does not exceed the initial overcurrent threshold value $TH_{OVC}(1)$. Regardless of whether or not the overcurrent actually occurs, a situation where the overcurrent cannot be detected occurs.

In the present embodiment, in a situation where the upper limit value of the corrected digital value D(A) becomes lower than the initial overcurrent threshold value $TH_{OVC}(1)$, the overcurrent threshold value $TH_{OVC}(2)$, which is lower than the upper limit value of the corrected digital value D(A), is set.

Figure 5:
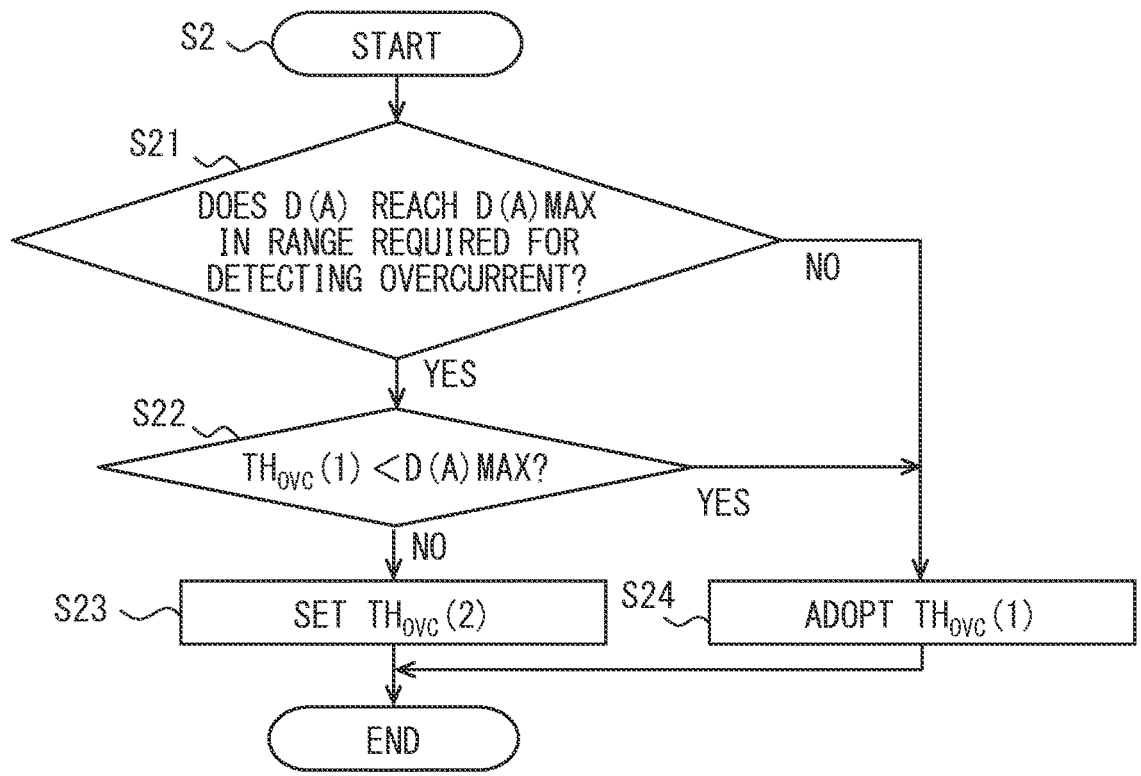
FIG. 5 illustrates an overcurrent threshold value setting process executed by a CPU.

FIG. 5 illustrates an overcurrent threshold setting process S2 executed by the CPU 24. The overcurrent threshold setting process S2 is a process as a threshold setting device. The overcurrent threshold value setting process S2 is started by an operator's start operation after the correction coefficient is calculated and then stored in the non-volatile memory inside the MPU 20 as shown in FIG. 2.

S21 determines whether or not the corrected digital value D(A) reaches the upper limit value (A)MAX as an upper limit value in a range of the main current IOUT required for detecting the overcurrent. In a situation where the main current IOUT, at a time where the digital value D reaches the upper limit value D(A)MAX in the actual product line calculated in S12, is smaller than the main current IOUT indicated by the upper limit value of the range required for detecting the overcurrent, the determination of S21 turns to YES.

In a situation where the determination of S21 is YES, the process proceeds to S22. S22 determines whether or not the upper limit value D(A)MAX of the corrected digital value D(A) is larger than the initial overcurrent threshold value $TH_{OVC}(1)$. The upper limit value D(A)MAX of the corrected digital value D(A) is a value acquired by multiplying the correction coefficient calculated in S12 to the upper limit value of the uncorrected digital value D.

In a situation where the determination in S22 is NO, the process proceeds to S23. In a situation where the process proceeds to S23, the corrected digital value D(A) does not exceed the initial overcurrent threshold value $TH_{OVC}(1)$ in the range of the main current IOUT required for detecting the overcurrent. Therefore, S23 sets the corrected overcurrent sets the corrected overcurrent threshold value $TH_{OVC}(2)$. The corrected overcurrent threshold value $TH_{OVC}(2)$ is set to a value smaller than the upper limit value of the corrected digital value D(A), in other words, a value closer to the range of a normal value than the upper limit value of the corrected digital value D(A). The range of the normal value is a range of values, which are smaller than the upper limit value D(A)MAX of the corrected digital value D(A).

The corrected overcurrent threshold value $TH_{OVC}(2)$ is a value smaller than the upper limit value D(A)MAX of the corrected digital value D(A), and is set to a value larger than or equal to a lower limit value of the range required for detecting the overcurrent. FIG. 4 illustrates that the straight line indicating $D=TH_{OVC}(2)$ is at a side lower than the upper limit value D(A)MAX, and illustrates that the intersection of the straight line and the ideal line means that the corrected overcurrent threshold value $TH_{OVC}(2)$ is set within the range required for detecting the overcurrent.

The value (D(A)MAX−α) is acquired by subtracting a preset constant value α from the upper limit value D(A). In a situation where the main current IOUT, which is obtained by substituting the value (D(A)MAX−α) into the ideal line, is larger than or equal to the lower limit value of the range required for detecting the overcurrent, the value (D(A)MAX−α) is set as the corrected overcurrent threshold value $TH_{OVC}(2)$.

In a situation where the main current IOUT, which is acquired by substituting the value (D(A)MAX−α) into the ideal line, is smaller than the lower limit value of the range required for detecting the overcurrent, the value, which is acquired by substituting the lower limit value of the range required for detecting the overcurrent into the ideal line, is set as the corrected overcurrent threshold value $TH_{OVC}(2)$.

In a situation where the determination of S21 is NO, or in a situation where the determination of S22 is YES, the process proceeds to S24. S24 determines that the overcurrent threshold value $TH_{OVC}$ adopted in the overcurrent detection process is set as the initial overcurrent threshold value $TH_{OVC}(1)$.

Current Fault Detection Processing

Figure 6:
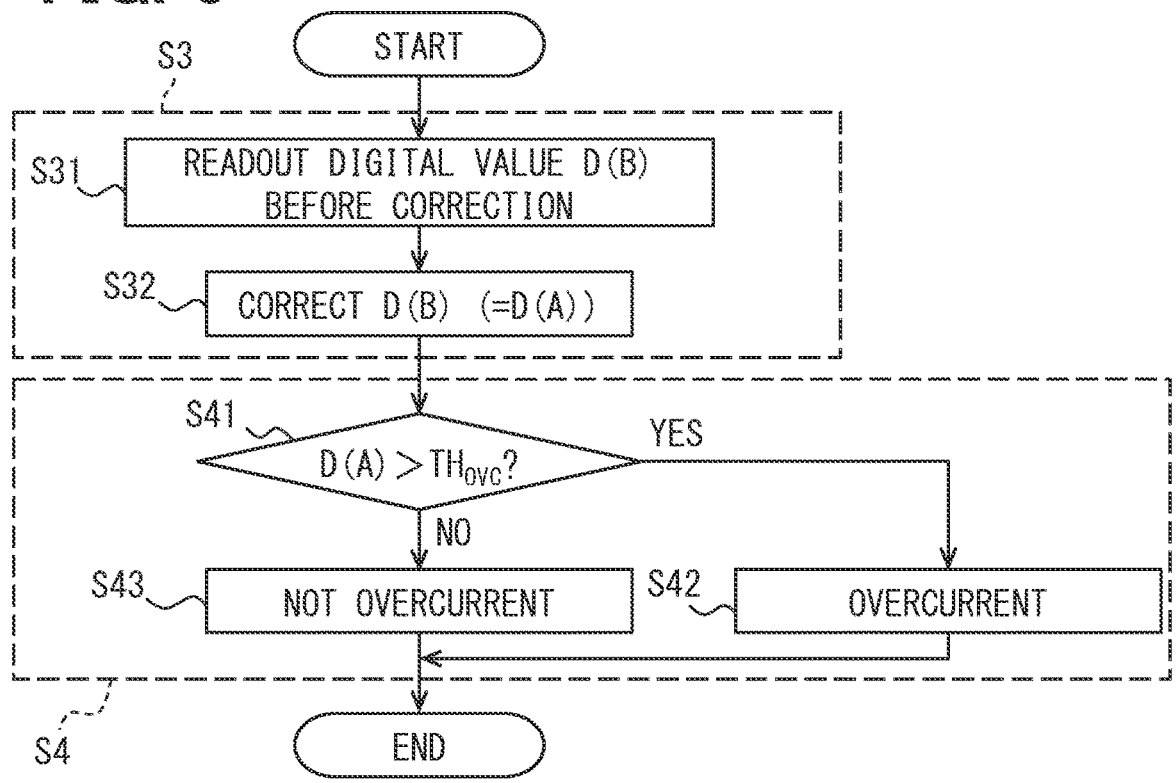
FIG. 6 illustrates a fault determination process executed by the CPU.

The following describes the overcurrent detection process executed by the CPU 24 periodically. FIG. 6 illustrates the overcurrent detection process. The CPU 24 executes the process shown in FIG. 6 at regular intervals while in an electrical conduction state.

Initially, a correction process S3 as a corrector is executed. S3 includes S31 and S32. In S11, the ADC 22 readouts the digital value D before correction (hereinafter referred to as an uncorrected digital value D(B)). In S32, a correction by multiplying the correction coefficient calculated in S12 to the uncorrected digital value D(B) readout in S31. Therefore, the corrected digital value D(A) is acquired. The correction coefficient is a coefficient for adjusting the slope of the actual product line to the slope of the ideal line, and the slope of the actual product line and the ideal line represents the on-resistances RonS, RonK. The correction through multiplying the correction coefficient to the uncorrected digital value D(B) is a correction for adjusting the uncorrected digital value D(B) to a value in a situation where the on-resistances RonS, RonK of the actual product are catalog values (in other words, standard resistance values).

Subsequently, a fault detection process S4 as a fault detector is executed. S4 includes S41, S42, and S43. S41 determines whether or not the corrected digital value D(A) acquired in S32 is larger than the overcurrent threshold value $TH_{OVC}$. The overcurrent threshold value $TH_{OVC}$ adopted in S41 is the corrected overcurrent threshold value $TH_{OVC}(2)$ in a situation of executing S23, and is the initial overcurrent threshold value $TH_{OVC}(1)$ in a situation of executing S24.

In a situation where the determination of S41 is YES, the process proceeds to S42. In S42, it is assumed that an overcurrent is detected. Subsequently, the OFF signal for turning off the main MOSFET 31 and the sense MOSFET 32 is output to the DAC 23. In a situation where the determination in S43 is NO, the process proceeds to S43. In S43, it is considered that there is no overcurrent.

In the present embodiment described above, even when the overcurrent flows through the electric circuit 10, the corrected overcurrent threshold $TH_{OVC}$ is set in view of the possibility that the corrected digital value D(A) does not exceed the initial overcurrent threshold value $TH_{OVC}(1)$ depending on the actual product. The corrected overcurrent threshold value $TH_{OVC}(2)$ is set to a value closer to the range of the normal value than the upper limit value D(A)MAX of the corrected digital value D(A) defined by the range of the input voltage convertible by the ADC 22. Therefore, it is possible to reduce to possibility in which the corrected digital value D(A) does not exceed the overcurrent threshold value $TH_{OVC}$ when the overcurrent flows through the electric circuit 10. Therefore, the precision of detecting a fault in the electric circuit is enhanced.

In the present embodiment, in a situation where it is determined that the corrected digital value D(A) does not reach the upper limit value D(A)MAX in a range where the main current IOUT is in a range required for detecting the overcurrent (NO in S21), it is determined that the initial overcurrent threshold value $TH_{OVC}(1)$ is adopted in S24. Therefore, other than ordinarily adopting the corrected overcurrent threshold value $TH_{OVC}(2)$, it may be possible to lower the overcurrent threshold value $TH_{OVC}$. Therefore, it may be possible to detect the overcurrent at an early stage.

In the present embodiment, even in a situation where it is determined that the corrected digital value D(A) reaches the upper limit value D(A)MAX in a range where the main current IOUT is in a range required for detecting the overcurrent (YES in S21), it is determined that the initial overcurrent threshold value $TH_{OVC}(1)$ is adopted in S24 even in a situation where it is determined that the upper limit value D(A)MAX of the corrected digital value D(A) is larger than the initial overcurrent threshold value $TH_{OVC}(1)$. Therefore, other than ordinarily adopting the corrected overcurrent threshold value $TH_{OVC}(2)$, it may be possible to detect the overcurrent at an early stage.

Second Embodiment

The following describes the second embodiment. In the description of the second and subsequent embodiments, elements having the same reference numerals as those used so far are identical to the elements having the same reference numerals in the previous embodiment(s), unless otherwise specified. When only a part of the configuration is described, the embodiment described above can be applied to other parts of the configuration.

Figure 7:
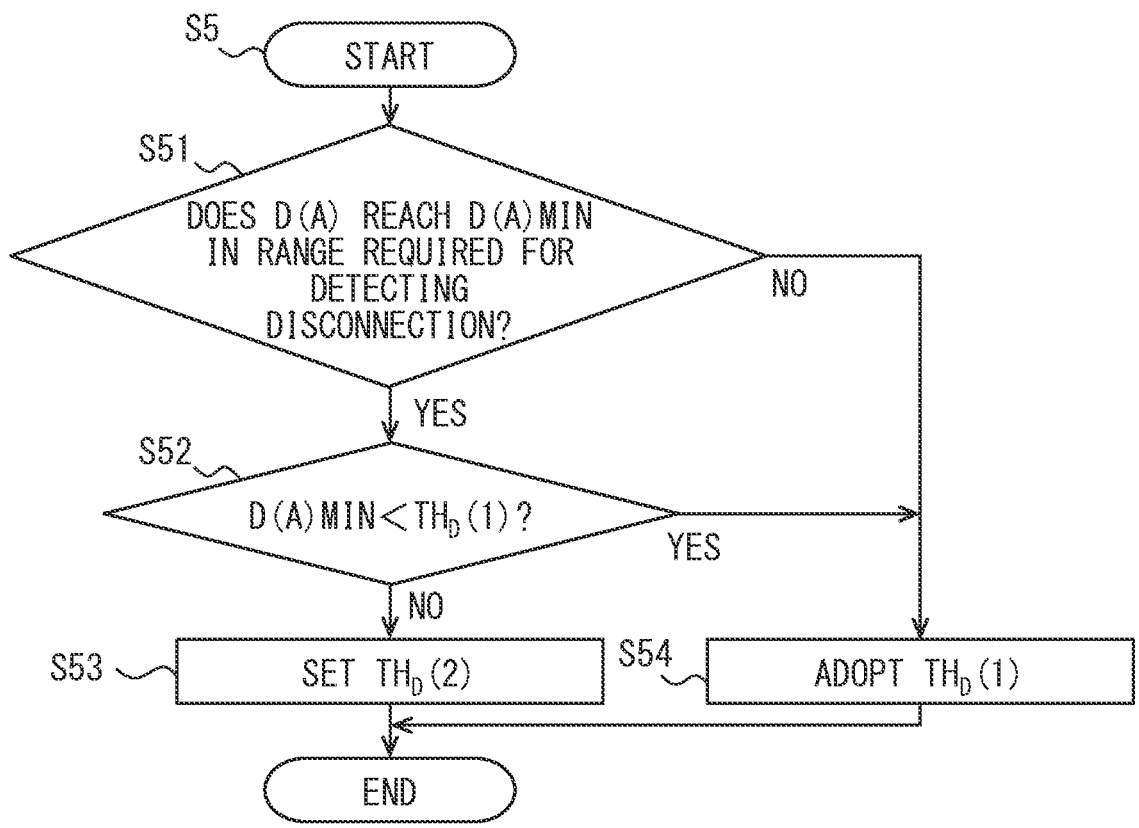
FIG. 7 illustrates a disconnection threshold value setting process executed by the CPU.

The second embodiment is different from the first embodiment in that the CPU 24 executes a disconnection detection process illustrated in FIG. 7 subsequent to the overcurrent detection process illustrated in FIG. 6. In a situation where a disconnection occurs in the electric circuit 10, the current value drops. Therefore, in a situation where the digital value D is lower than a threshold value set for disconnection detection, it can be considered that the disconnection occurs.

Even in a situation where the threshold value for disconnection detection is compared with the digital value D, a situation caused by, for example, variation in the on-resistances RonS, RonK occurs as identical to a situation of overcurrent detection. In other words, even when the disconnection occurs at the electric circuit 10, it is possible that the corrected digital value D(A) is not lower than an initial disconnection threshold $TH_D(1)$ set for disconnection detection. This is because there is a lower limit value determined by the variation in resistance values such as the on-resistances RonS, RonK and the range of input voltage convertible by the ADC 22.

In FIGS. 3, 4, the ideal line and the actual product line rise from the vicinity of the intersection of the two axes. The main current IOUT at the point where the ideal line and the actual product line rise can be set to 0 mA. In other words, the lower limit value detectable by the ADC 22 can be set to a value corresponding to the main current IOUT=0 mA. The lower limit value detectable by the ADC 22 can be set to a value corresponding to the main current IOUT larger than 0 mA to, for example, enhance the resolution of fault detection.

In a situation where the lower limit value detectable by the ADC 22 is set to a value corresponding to the main current IOUT larger than 0 mA, the corrected digital value D(A) may not be lower than the initial disconnection threshold value $TH_D(1)$. The initial disconnect threshold $TH_D(1)$ corresponds to the initial lower threshold.

Therefore, also for the disconnection detection process, a disconnection threshold value setting process S5, which decides whether to adopt the initial disconnection threshold value $TH_D(1)$ or the corrected disconnection threshold value $TH_D(2)$ as the disconnection threshold value $TH_D$ to be compared with the corrected digital value D(A) is executed. The CPU 24 executes the disconnection threshold value setting process S5 subsequent to the overcurrent threshold setting process S2.

FIG. 7 shows the disconnection threshold setting process S5. The disconnection threshold setting process S5 is a process as a threshold setting device. S51 determines whether or not the corrected digital value D(A) reaches a lower limit value D(A)MIN as a limit value at a lower side in the range of the main current IOUT required for detecting the disconnection. In a situation where the main current IOUT, at a time where the digital value D reaches the lower limit value D(A)MIN in the actual product line calculated in S12, is larger than the main current IOUT indicated by the lower limit value of the range required for detecting the disconnection, the determination of S51 turns to YES.

In a situation where the determination of S51 is YES, the process proceeds to S52. S52 determines whether or not the lower limit value D(A)MIN of the corrected digital value D(A) is smaller than the initial disconnection threshold value $TH_D(1)$. The lower limit value D(A)MIN of the corrected digital value D(A) is a value acquired by multiplying the correction coefficient calculated in S12 to the lower limit value of the uncorrected digital value D.

In a situation where the determination of S52 is NO, the process proceeds to S53. In a situation where the process proceeds to S53, the corrected digital value D(A) does not exceed the initial disconnection threshold value $TH_D(1)$ in the range of the main current IOUT required for detecting the disconnection. Therefore, S53 sets the corrected disconnection threshold value $TH_D(2)$. The corrected disconnection threshold $TH_D(2)$ is set to a value larger than a value larger than the lower limit value D(A)MIN of the corrected digital value D(A), in other words, a value closer to the range of the normal value than the lower limit value D(A) MIN of the corrected digital value D(A). The corrected overcurrent threshold value $TH_D(2)$ is a value smaller than the lower limit value D(A)MIN of the corrected digital value D(A), and is set to a value larger than or equal to a lower limit value of the range required for detecting the disconnection. The range of the normal value is a range of values, which are larger than the lower limit value D(A)MIN of the corrected digital value D(A).

The main current IOUT is acquired by substituting a value, which is acquired by adding a present constant value from the lower limit value D(A)MIN of the corrected digital value D(A), into the ideal line. In a situation where the main current IOUT is larger than or equal to the upper limit of the range required for detecting the disconnection, the value acquired by adding the preset constant value from the lower limit value D(A)MIN of the corrected digital value D(A) is set as the corrected overcurrent threshold value $TH_{OVC}(2)$.

The main current IOUT is acquired by substituting a value, which is acquired by adding a present constant value from the lower limit value D(A)MIN of the corrected digital value D(A), into the ideal line. On the other hand, in a situation where the main current IOUT is larger than or equal to the upper limit of the range required for detecting the disconnection, the value acquired by adding the preset constant value from the lower limit value D(A)MIN of the corrected digital value D(A) is set as the corrected disconnection threshold value $TH_D(2)$.

In a situation where the determination of S51 is NO, or in a situation where the determination of S52 is YES, the process proceeds to S54. S54 determines that the disconnection threshold value $TH_D$ adopted in the disconnection detection process is set as the initial disconnection threshold value $TH_D(1)$.

Figure 8:
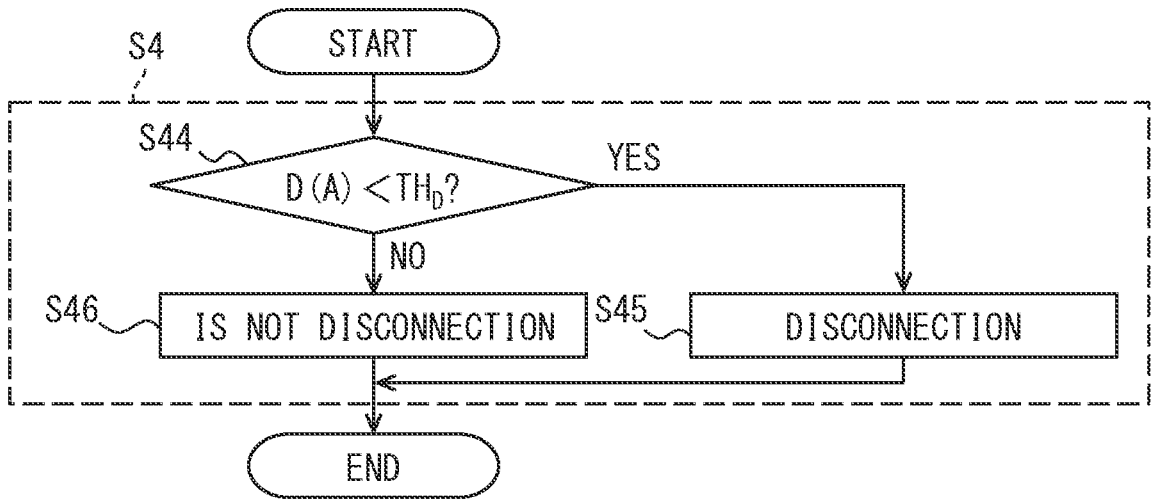
FIG. 8 illustrates a disconnection detection process executed by the CPU.

FIG. 8 illustrates the disconnection detection process executed by the CPU 24. In a situation where there is no overcurrent detected in the overcurrent detection process, the CPU 24 executes the process shown in FIG. 8. The process illustrated in FIG. 8 is a part of the fault detection process S4, and executes the process illustrated in FIG. 8 after executing S43 or S42.

S44 determines whether or not the corrected digital value D(A) acquired in S32 is smaller than the disconnection threshold value $TH_D$. The disconnection threshold value $TH_D$ adopted in S44 is the corrected disconnection threshold value $TH_D(2)$ in a situation of executing S53, and is the initial disconnection threshold value $TH_D(1)$ in a situation of executing S54.

In a situation where the determination of S44 is YES, the process proceeds to S45. In S45, it is considered that the disconnection is detected. A fault indicator lamp may be provided at a position visible from the outside of the device, and the fault indicator lamp may be turned on in a situation of detecting the disconnection. In a situation where the determination in S44 is NO, the process proceeds to S46. In S46, it is assumed that no disconnection has occurred.

In the second embodiment, the corrected disconnection threshold value $TH_D(2)$ is set in S53 in view of the possibility in that the lower limit value of the corrected digital value D(A) is not lower than the initial disconnection threshold value $TH_D(1)$. Therefore, it is possible to reduce to possibility in which the corrected digital value D(A) does not become lower than the overcurrent threshold value $TH_D$ when the disconnection occurs in the electric circuit 10. Therefore, the precision of detecting the disconnection in the electric circuit 10 is enhanced.

Although the embodiments of the present disclosure have been described above, the present disclosure is not limited to the above embodiments, and various modified examples described below are also included in the technical scope of the present disclosure. Furthermore, various modifications other than the following can be made without departing from the gist.

First Modification

Figure 9:
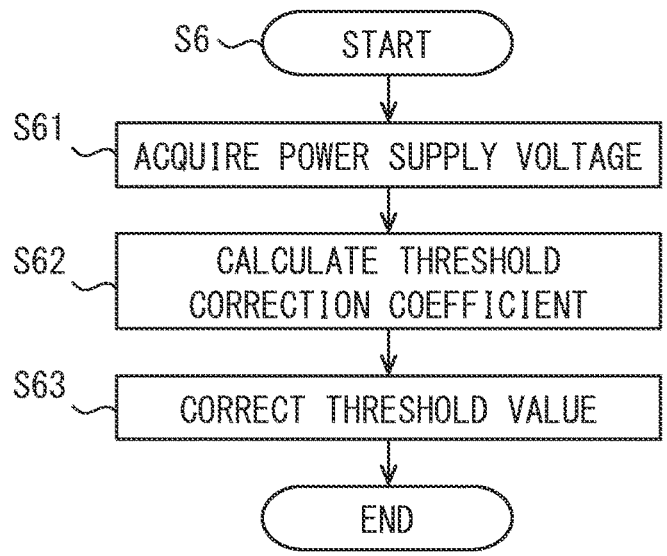
FIG. 9 illustrates a process executed by the CPU in a first modification.

In a first modification, in the first embodiment or the second embodiment, the CPU 24 executes the threshold value correction process S6 shown in FIG. 9. The process shown in FIG. 9 is periodically executed at a cycle equal to or longer than the execution cycle in FIG. 6. Initially, a threshold value correction process S6 as a threshold value corrector is executed.

S61 acquires the value of the power supply voltage +B. A calculator separately provided from the MPU 20 sequentially measures the power supply voltage +B, in a situation where the calculator and the MPU 20 are mutually connected, the calculator can acquire the value of the power supply voltage +B. The MPU 20 may also measure the power supply voltage +B. In a situation where the MPU 20 measures the power supply voltage +B, the MPU 20 includes an ADC for measuring the power supply voltage +B.

S62 calculates a threshold correction coefficient. The threshold correction coefficient is acquired through dividing the value of the power supply voltage +B acquired in S61 by the reference value of the power supply voltage +B. In S63, the threshold correction coefficient acquired in S62 is multiplied to the overcurrent threshold value $TH_{OVC}$ adopted in FIG. 6. In a situation of executing the process shown in FIG. 8, the threshold correction coefficient acquired in S62 is multiplied to the disconnection threshold value $TH_D$ adopted in S44. In FIGS. 6, 8, the newest threshold value TH corrected by the executing the process in FIG. 9 is adopted.

In the first modification, in a situation where the initial overcurrent threshold value $TH_{OVC}(1)$ is adopted or the corrected overcurrent threshold value $TH_{OVC}(2)$ is adopted, the overcurrent threshold value THOVC is varied according to the magnitude of the power supply voltage +B as a voltage input to the electric circuit 10. In a situation where the initial disconnection threshold value $TH_D(1)$ is adopted or the corrected disconnection threshold value $TH_D(2)$ is adopted, the disconnection threshold value $TH_D$ is varied according to the magnitude of the power supply voltage +B as a voltage input to the electric circuit 10. Therefore, even in a situation where the power supply voltage +B varies, the overcurrent threshold value $TH_{OVC}$ and the disconnection threshold value $TH_D$ according to the power supply voltage +B are set so that the overcurrent detection or the disconnection detection can be executed.

Second Modification

Figure 10:
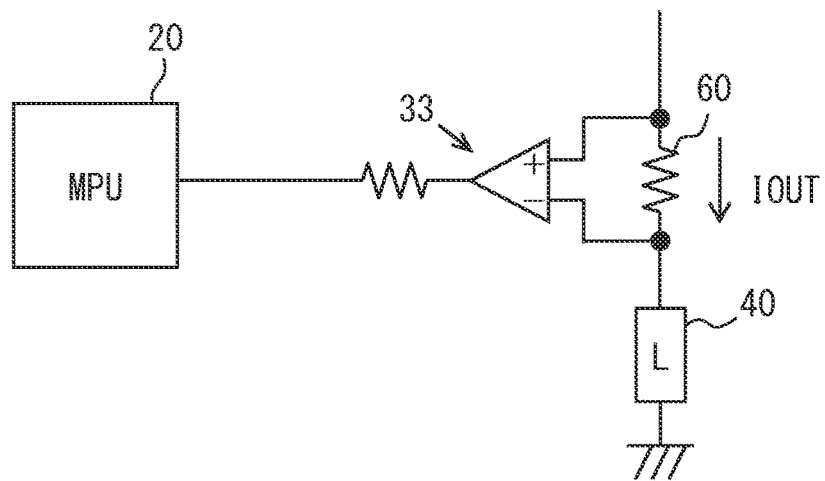
FIG. 10 illustrates a circuitry configuration in a second modification.

In the embodiments, the sense MOSFET 32 is a circuit fault detection element. However, the circuit fault detection element is not limited to the sense MOSFET 32. In FIG. 10, a resistor 60 is provided as a circuit fault detection element. In FIG. 10, the inverting input terminal of the operational amplifier 33 is connected to a first end of the resistor 60, and the non-inverting input terminal of the operational amplifier 33 is connected to a second end of the resistor 60. The output of the operational amplifier 33 is input to the MPU 20. Even with the above configuration, it is possible to determine whether or not the current flowing through the electric circuit including the load 40 has a fault.

Third Modification

Figure 11:
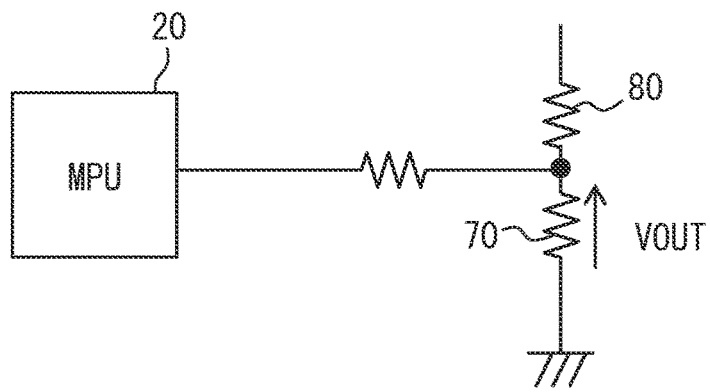
FIG. 11 illustrates a circuitry configuration in a third modification.

With regard to the above description, although the ADC 22 directly measures the voltage value, the target measurement value is the current, and the voltage value indicating the magnitude of the current value is detected by the ADC 22. However, the target measurement value may also be the voltage. In FIG. 11, a resistor 70 is provided as the circuit fault detection element. The MPU 20 detects a voltage applied to an end of the resistor 70 through the ADC 22. Therefore, it is possible to detect a voltage fault in the electric circuit having the resistor 70.

Fourth Modification

With regard to the above description, the digital value D is compared with the threshold value TH. However, a fault in the electric circuit 10 may also be detected by comparing the voltage value, which is acquired by multiplying the voltage conversion coefficient to the digital value D, with the threshold value TH set for the voltage value. The voltage value, which is acquired by multiplying the voltage conversion coefficient to the digital value D, is an example of the measurement values.

Fifth Modification

In the first embodiment, the overcurrent threshold value setting process S2 executes the determination of S21 and S22 to decide whether to adopt the initial overcurrent threshold value $TH_{OVC}(1)$ or the corrected current threshold value $TH_{OVC}(2)$ as the overcurrent threshold value $TH_{OVC}$. However, the corrected overcurrent threshold value $TH_{OVC}(2)$ may be adopted in a usual basis. Also in the second embodiment, the corrected disconnection threshold value $TH_D(2)$ may be adopted in a usual basis.

The process of the flowchart or the flowchart described in this application includes a plurality of sections (or steps), and each section is expressed as, for example, S1. Each section may be divided into several subsections, while several sections may be combined into one section. Furthermore, each section thus configured may be referred to as a device, module, or means.

The present disclosure has been described based on examples, but it is understood that the present disclosure is not limited to the examples or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. A circuit fault detection apparatus for detecting a fault in an electric circuit, comprising:
    an AD conversion circuit configured to detect a voltage corresponding to a current flowing through a circuit fault detection element connected to the electric circuit or a voltage applied to the circuit fault detection element, and convert the voltage to a digital value;
    a corrector configured to correct the digital value output by the AD conversion circuit or a measurement value as a voltage value representative of the digital value to a corrected measurement value as a value in a situation where a resistance value of the circuit fault detection element is preliminarily set to a standard resistance value;
    a threshold value setting device configured to set a threshold value, which is compared with the corrected measurement value, closer to a normal value side than a limit value of the corrected measurement value determined based on a convertible range of the AD conversion circuit; and
    a fault detector configured to detect whether or not the fault occurs in the electric circuit, based on comparison between the threshold value set by the threshold value setting device and the corrected measurement value.

2. The circuit fault detection apparatus according to claim 1,
    wherein the threshold value setting device is further configured to set an upper threshold value as the threshold value for determining whether or not the measurement value is larger than an upper limit value of a normal range,
    wherein the fault detector is further configured to determine that the fault in which a measurement target quantity is excessively large occurs, based on a condition that the measurement value is larger than the upper threshold value, and
    wherein the measurement target quantity is one of a current flowing through the electric circuit and a voltage applied to the electric circuit.

3. The circuit fault detection apparatus according to claim 2,
    wherein, based on a condition that the corrected measurement value does not reach an upper limit value within a range of the measurement target quantity required for detecting the fault, the threshold value setting device is configured to set an initial upper threshold value, which is preset as an initial value of the upper threshold value, as the upper threshold value.

4. The circuit fault detection apparatus according to claim 2,
    wherein, based on a condition that: (i) the corrected measurement value reaches an upper limit value within a range of the measurement target quantity required for detecting the fault; and (ii) an upper limit value of the corrected measurement value is larger than an initial upper threshold value preset as an initial value of the upper threshold value, the threshold value setting device is configured to set the initial upper threshold value as the upper threshold value.

5. The circuit fault detection apparatus according to claim 1, further comprising:
    a threshold value corrector configured to correct the threshold value set by the threshold value setting device to a corrected threshold value according to a value of a voltage input to the electric circuit,
    wherein the fault detector is configured to compare the corrected measurement value with the corrected threshold value.

6. The circuit fault detection apparatus according to claim 1,
    wherein the threshold value setting device is configured to set a lower threshold value as the threshold value for determining whether or not the measurement value is lower than a normal range, and wherein the fault detector is configured to detect the fault in which the electric circuit has a disconnection, based on the measurement value is smaller than the lower threshold value.

7. The circuit fault detection apparatus according to claim 1, wherein the limit value of the corrected measurement value is an upper limit value, and wherein the normal value side is a range of values smaller than the upper limit value.

8. The circuit fault detection apparatus according to claim 1, wherein the limit value of the corrected measurement value is a lower limit value, and wherein the normal value side is a range of values larger than the lower limit value.

9. A circuit fault detection apparatus for detecting a fault in an electric circuit, comprising:

an AD conversion circuit configured to detect a voltage corresponding to a current flowing through a circuit fault detection element connected to the electric circuit or a voltage applied to the circuit fault detection element, and convert the voltage to a digital value; and a microprocessor configured to:

correct the digital value output by the AD conversion circuit or a measurement value as a voltage value representative of the digital value to a corrected measurement value as a value in a situation where a resistance value of the circuit fault detection element is preliminarily set to a standard resistance value;

set a threshold value, which is compared with the corrected measurement value, closer to a normal value side than a limit value of the corrected measurement value determined based on a convertible range of the AD conversion circuit; and detect whether or not the fault occurs in the electric circuit, based on comparison between the threshold value set by the threshold value setting device and the corrected measurement value.

* * * * *